(12) United States Patent
Rochefort et al.

(10) Patent No.: US 7,394,144 B2
(45) Date of Patent: Jul. 1, 2008

(54) TRENCH SEMICONDUCTOR DEVICE AND METHOD OF MANUFACTURING IT

(75) Inventors: Christelle Rochefort, Crolles (FR); Erwin A. Hijzen, Blanden (BE); Philippe Meunier-Beillard, Bertem (BE)

(73) Assignee: NXP B.V., Eindhoven (NL)

( * ) Notice: Subject to any disclaimer, the term of this patent is extended or adjusted under 35 U.S.C. 154(b) by 57 days.

(21) Appl. No.: 10/594,487

(22) PCT Filed: Mar. 29, 2005

(86) PCT No.: PCT/IB2005/051056
§ 371 (c)(1),
(2), (4) Date: Sep. 27, 2006

(87) PCT Pub. No.: WO2005/096389
PCT Pub. Date: Oct. 13, 2005

(65) Prior Publication Data
US 2007/0222019 A1    Sep. 27, 2007

(30) Foreign Application Priority Data
Mar. 31, 2004    (GB)    ................... 0407363.1

(51) Int. Cl.
H01L 29/78 (2006.01)
H01L 29/06 (2006.01)
H01L 21/336 (2006.01)
H01L 21/764 (2006.01)

(52) U.S. Cl. .................... 257/522; 438/422; 438/430

(58) Field of Classification Search ................ 438/422, 438/424, 430; 257/493, 520, 522, 622, E21.573
See application file for complete search history.

(56) References Cited

U.S. PATENT DOCUMENTS

| 5,306,659 | A | * | 4/1994 | Beyer et al. | 438/404 |
| 5,324,683 | A | * | 6/1994 | Fitch et al. | 438/422 |
| 5,326,711 | A | * | 7/1994 | Malhi | 438/138 |
| 5,696,010 | A | * | 12/1997 | Malhi | 438/279 |
| 6,337,499 | B1 | * | 1/2002 | Werner | 257/329 |
| 6,512,267 | B2 | | 1/2003 | Kinzer et al. | |
| 6,620,703 | B2 | * | 9/2003 | Kunikiyo | 438/422 |
| 6,921,704 | B1 | * | 7/2005 | Wu et al. | 438/421 |
| 7,049,658 | B2 | * | 5/2006 | Saito et al. | 257/341 |

(Continued)

OTHER PUBLICATIONS

Rochefort C. et al: "Manufacturing of High Aspect-Ratio P-N Junctions Using Vapor Phase Doping for Application in Multi-Resurf Devices"; Proceedings of the 14th International Symposium on Power Semiconductor Devices and ICs; 2002 pp. 237-240.

*Primary Examiner*—M. Wilczewski
(74) *Attorney, Agent, or Firm*—Peter Zawilski

(57) ABSTRACT

Consistent with an example embodiment, a reduced surface field effect type (RESURF) semiconductor device is manufactured having a drift region over a drain region. Trenches are formed through openings in mask. A trench insulating layer is deposited on the sidewalls and base of the trenches followed by an overetching step to remove the trench insulating layer from the base of the trenches as well as the top of the sidewalls of the trenches adjacent to the first major surface leaving exposed silicon at the top of the sidewalls of the trench and the base of the trenches. Silicon is selectively grown plugging the trenches with silicon plug (18) leaving void.

14 Claims, 4 Drawing Sheets

U.S. PATENT DOCUMENTS

| | | | |
|---|---|---|---|
| 7,087,959 B2 * | 8/2006 | Shibib et al. | 257/335 |
| 7,294,886 B2 * | 11/2007 | Saito et al. | 257/341 |
| 2003/0136994 A1 | 7/2003 | Popp et al. | |
| 2005/0173776 A1 * | 8/2005 | Dalen et al. | 257/483 |
| 2006/0071267 A1 * | 4/2006 | Saito et al. | 257/327 |
| 2007/0069324 A1 * | 3/2007 | Takaishi | 257/493 |
| 2007/0126055 A1 * | 6/2007 | Hueting et al. | 257/330 |
| 2007/0228496 A1 * | 10/2007 | Rochefort et al. | 257/409 |

* cited by examiner

TRENCH SEMICONDUCTOR DEVICE AND METHOD OF MANUFACTURING IT

The invention relates to a method of manufacturing a semiconductor device having trenches, and in particular to a method of manufacturing a semiconductor diode or transistor of the type known as a reduced surface field (RESURF) device. The invention also relates to a trench semiconductor device.

A method of manufacturing a semiconductor device is described in Rochefort et al, "Manufacturing of high aspect ratio p-n junctions using Vapor Phase Doping for application in multi-Resurf devices", Proceedings of the 14th International Symposium on Power Semiconductor Devices and ICs, 2002, pages 237 to 240.

The method involves depositing a p-type layer on an n-type epilayer on an n+ substrate. Trenches are formed through the p-type layer and n-type layer. The sidewalls of the trench are doped with boron using vapour phase doping. Then, oxide is deposited to fill the trenches and cover the surface. The oxide is etched back to leave oxide filling the trenches, and a metallic contact formed on the rear of the n+ substrate and on the front to contact to the p-type layer.

The device formed is a Resurf (reduced surface field) p-n diode in which the p-type layers adjacent to the n-type epilayer act to deplete the n-type epilayer when the device is turned off. This can increase the device breakdown voltage.

U.S. Pat. No. 6,512,267 describes a prior superjunction FET in which depletion in a drift region when the device is turned off is obtained using a structure in which an n-type layer is provided along one sidewall of a trench and a p-type layer on the opposite sidewall. The trench walls are insulated using tetra-ethyl orthosilicate (TEOS) and the trench is plugged with an insulating, oxide cap.

U.S. Pat. No. 6,337,499 describes a very similar structure to U.S. Pat. No. 6,512,267.

According to the invention there is provided a method of manufacturing a semiconductor device, comprising:

(a) providing a silicon semiconductor body having opposed first and second major surfaces having a lower-doped region at the first major surface above a higher doped region, the lower-doped region and the higher-doped region both being doped to have a first conductivity type, the lower-doped region having a lower doping than the higher-doped region;

(b) defining a mask having openings on the first major surface;

(c) forming trenches through the openings in the mask, the trenches extending from the first major surface towards the second major surface through the lower-doped region towards the higher-doped region;

(d) depositing a trench insulating layer on the sidewalls and base of the trenches as well as the first major surface;

(e) removing the trench insulating layer from the top of the sidewalls of the trenches adjacent to the first major surface leaving exposed silicon at the top of the sidewalls of the trench; and (f) growing silicon selectively on the exposed silicon to grow silicon at the top of the trenches and plugging the top of the trenches, wherein the method further includes defining a structure for depleting the lower-doped region in an operating state of the semiconductor device to allow the lower-doped region to support a voltage in that operating state.

The invention is concerned with semiconductor devices with field shaping regions, often referred to as RESURF (reduced surface field) devices. In these devices, when the device is switched off, the lower doped region is depleted to support the voltage.

The trench insulating layer is preferably thin, i.e. at most 10% of the width of the trench.

In preferred embodiments, the method further includes the step of doping the sidewalls of the trenches to have a second conductivity type opposite to the first conductivity type before depositing the trench insulating layer. These doped sidewalls form the structure for depleting the lower doped region when the device is switched off. In this way, the doping in the lower doped region can be higher than if the doped layers were not present, thereby improving the properties of the device when the device is on. This RESURF effect can accordingly reduce the specific on-resistance for a given breakdown voltage, or alternatively increase the breakdown voltage for a given specific on-resistance.

The inventors have realised that the method in the prior art ISPSD paper is not practicable for high aspect ratio trenches. It is difficult to fill dielectric into high aspect ratio trenches which are required for higher breakdown voltages. One problem is that voids in the trenches often open in the prior art structure after etch-back. The method according to the invention however works well for both low and high aspect ratio trenches.

Another problem with prior arrangements is stress. After filling the trench with oxide the thermal budget is limited and the temperature cannot be raised in view of the mechanical stresses caused by the thermal treatment. In contrast, the method according to the invention can support much higher temperatures after growing the silicon selectively.

Further, the invention allows the use of trenches with a variety of trench shapes which may be difficult to fill.

US-A-2003/0136994 describes a process for capping a trench using selective growth. However, this document presents the method as forming cavities where they have previously been provided, such as in the capacitors of DRAMs and in pressure sensors, and does not suggest the provision of cavities capped with silicon in the drift region of RESURF devices. The document accordingly provides no suggestion of improving the manufacture of such devices.

The device according to the invention delivers advantages in terms of process flow.

The borophosphorous silicate glass (BPSG) of U.S. Pat. No. 6,337,499 is doped and will inevitably cover the sidewalls of the trenches as well as the first major surface. Since this glass contains significant doping charge, this could influence the RESURF effect.

The oxides used for reflow as in U.S. Pat. No. 6,512,267 are not generally suitable for front-end processing, since they contain a lot of contaminants.

In contrast the method according to the invention can be used at any stage of the process. This in turn has the further advantage that the trenches can be capped before gate deposition. This is a big advantage since it allows gate connections to run over the trenches. Thus, in the prior art arrangements using an oxide to cap the trenches the gates can only be contacted with individual contacts to metal, or with difficult processing steps.

Thus, the method according to the invention can allow efficient, straightforward and cost-effective design. Further, it does not restrict processing options.

The method according to the invention produces a device with a number of advantages over these prior devices, exploiting the electrical connection provided by the silicon plug at the top of the trench. The doping in the silicon plug may be adjusted to achieve the desired conductivity.

Firstly, the silicon layer provides an electrical connection across the top of the trench and hence between adjacent mesas. This helps provide a connection to the p-type body and allows a smaller pitch size.

Secondly, the trenches can be used in an edge termination which simply uses the silicon plug to connect adjacent body regions on opposite sides of a trench through a high resistance plug. This allows the trenches and body regions to form an effective edge termination structure as will be explained in more detail below.

The method may further include step (g) forming a body region being semiconductor doped to be of second conductivity type opposite to the first conductivity type at or adjacent to the first major surface and adjacent to the trenches.

Step (e) may comprise overetching to remove the trench insulating layer from the base of the trenches and the first major surface as well as the top of the sidewalls of the trenches adjacent to the first major surface leaving exposed silicon at the top of the sidewalls of the trench and the base of the trenches The method may further include the steps:

(h) forming a source region of semiconductor doped to be of the first conductivity type at or adjacent to the first major surface and in contact with the body region; and (i) forming an insulated gate for controlling conduction between source and higher doped region through the body.

Although some preceding paragraphs refer to "body", "source" and "drain" layers the invention is not just applicable to a FET but also to any type of semiconductor device using the reduced surface field effect, for example a diode, insulated gate bipolar transistor or conventional bipolar transistor.

For simplicity of notation, the terms "body", "drain" and "source" will be used regardless of the type of device under discussion. Thus, in the case of a diode, the term "body" as used herein refers to one of the anode and the cathode and the "drain" is the other of the anode and cathode. In the case of a bipolar transistor, the "body" may be considered to be the base, the "drain" the collector, and the "source" the emitter.

The invention may also be used to form an edge termination structure in an edge termination region at the edge of a device. In this case also, the source region is not required.

The method may further include the step of doping the sidewalls of the trenches to have a second conductivity type before depositing the trench insulating layer. This region of second conductivity type forms the structure for depleting the lower-doped region when the device is turned off thereby allowing a higher doping in the lower-doped region than would otherwise be possible for a given breakdown voltage, or alternatively an improved breakdown voltage keeping other properties the same.

Alternatively or additionally, the method may include the step of depositing semi-insulating polysilicon (SIPOS) on the sidewalls of the trenches to form the structure for depleting the lower-doped layer.

In particular, the method may include the steps, after step (c), of:

depositing an outer trench insulating layer on the sidewalls of the trench and the top surface;

removing the outer trench insulating layer from the base of the trench;

depositing semi-insulating polysilicon (SIPOS) in the trench; and depositing the trench insulating layer.

The overetching step may then include one or more etching steps etching the outer insulating layer, the semi-insulating polysilicon and the trench insulating layer to expose the sidewalls of the trenches adjacent to the first major surface.

The SIPOS drops a voltage relatively uniformly along its length when the device is switched off thereby making the electric field more uniform in the lower-doped region when sustaining a voltage thus improving the breakdown voltage of the finished device.

In a particular embodiment, step (e) includes the sub-steps of:

growing silicon selectively on the sidewalls at the top of the trench leaving a gap between the silicon grown on opposed sidewalls;

depositing a further silicon layer on the first major surface and on the sidewalls of the trench plugging the gap in the trench; and removing the silicon layer deposited on the first major surface, leaving the further silicon layer plugging the gap and on the sidewalls.

The further silicon layer may be a semi-insulating polysilicon layer. In this way, vertical semi-insulating polysilicon may be readily provided on the sidewalls of the trench to drop voltage uniformly in the lower-doped region thus improving the breakdown voltage as above.

In another aspect, the invention relates to the semiconductor device formed by the method set out above.

In particular, the invention relates, in an aspect, to a semiconductor device, comprising:

a silicon semiconductor body having opposed first and second major surfaces having a lower-doped region above a higher-doped region, the lower-doped region and the higher-doped region both being doped to have a first conductivity type;

trenches extending from the first major surface towards the second major surface through the lower-doped region towards the higher-doped region;

a silicon plug plugging the top of the trenches above a void in the trenches; and a structure for depleting the lower-doped region in an operating state of the semiconductor device to allow the lower-doped region to support a voltage in that operating state.

The semiconductor adjacent to the sidewalls of the trenches may be doped to be of a second conductivity type to form the structure for depleting the lower doped region.

Alternatively or additionally, a SIPOS layer to form the lower-doped region may be provided extending along the sidewalls of the trenches, the semi-insulating polysilicon being in electrical connection between the semiconductor under the trench and the semiconductor plug at the top of the trench.

The semiconductor device may include an edge termination structure and accordingly may include an active region and an edge termination region around the active region, wherein a plurality of the trenches form an edge termination structure in the edge termination region, the body region extending between the trenches, the silicon plug being undoped in the edge termination region to form a high-resistance path between the body region on either side of the trenches.

In preferred embodiments, a plurality of the trenches are formed in the active region, the silicon plugs being doped in the active region to electrically connect the two sides of the trenches together.

In the event that the device is a FET the device includes a body region being semiconductor doped to be of second conductivity type at or adjacent to the first major surface and a source region of semiconductor doped to be of the first conductivity type at or adjacent to the first major surface and in contact with the body region; and an insulated gate for controlling conduction between source and drain through the body.

For a better understanding of the invention, specific embodiments will now be described, purely by way of example, with reference to the accompanying drawings, in which.

The diagrams are purely schematic and not to scale. Like or corresponding components are given the same reference numerals in different figures.

Figure 1:
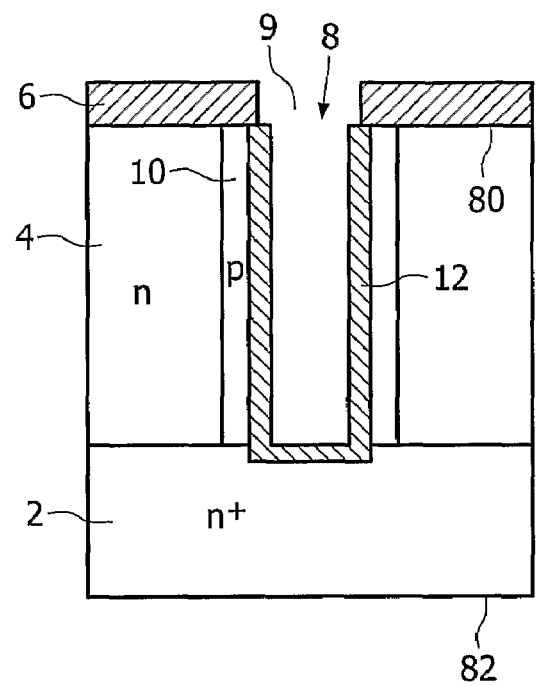
FIG. 1 shows a schematic of a first step in a method according to a first embodiment of the invention.
Figure 2:
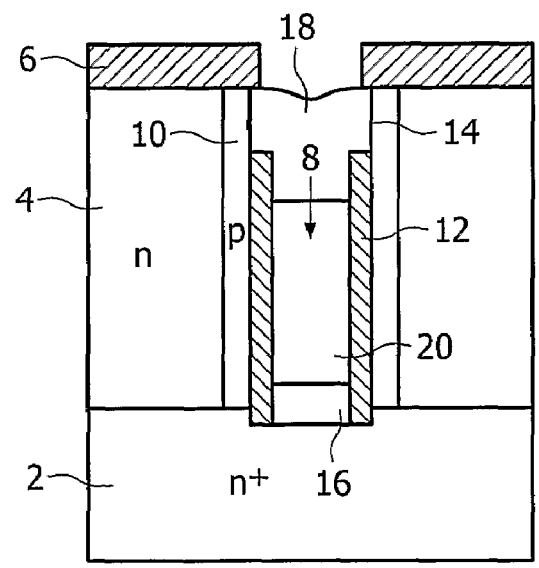
FIG. 2 shows a schematic of a second step in a method according to a first embodiment of the invention.
Figure 3:
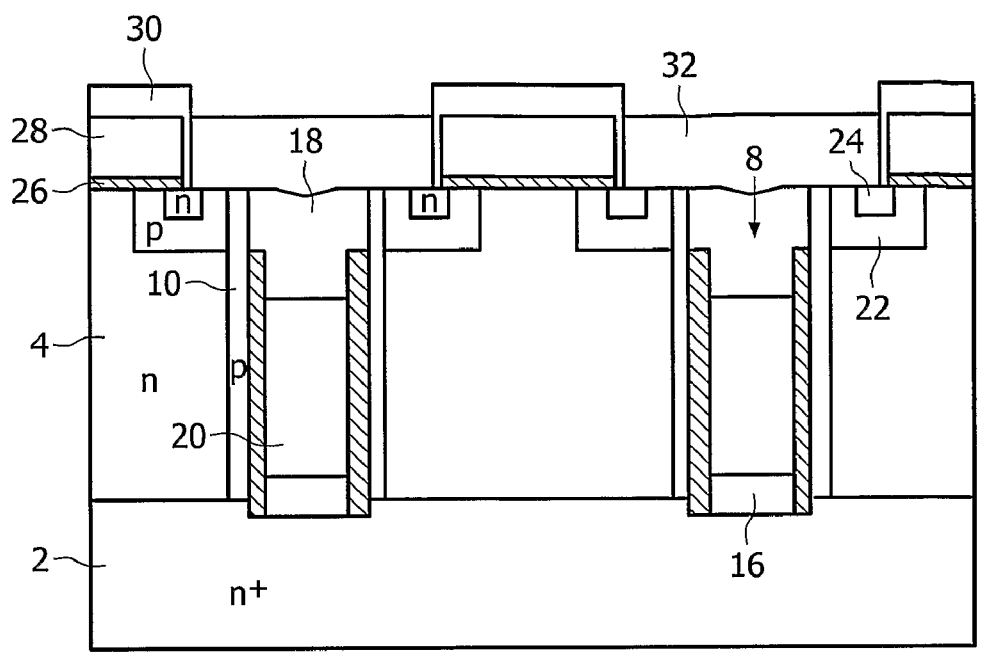
FIG. 3 shows a finished device made according to the first embodiment.

Referring to FIGS. 1 to 3, a first embodiment of a method of manufacturing a device according to the invention will be described.

A higher-doped silicon substrate 2 is doped n+ and covered with a lower-doped epilayer 4 doped n-type. An oxide hard mask 6 is deposited and patterned to have openings 9. Trenches 8 are then etched through the openings 9. In the specific example the epilayer 4 has a thickness just less than 12 microns and the trenches are 12 microns deep and 1.5 microns wide, though these values may of course be varied if required. The doping in the epilayer 4, which forms the drift region, may be of order $2 \times 10^{15}$ cm$^{-3}$ to $10^{16}$ cm$^{-3}$, for example, for this thickness. In the specific example described the doping is $5 \times 10^{15}$ cm$^{-3}$.

Vapour phase doping is then performed as described in the paper by Rochefort et al mentioned above to form p-type doped layers 10 along the sidewalls of the trench. Then, a thin oxide layer 12 is grown on the sidewalls or base of the trench—in alternative embodiments this thin oxide layer 12 may be deposited.

This results in the intermediate structure shown in FIG. 1. The semiconductor body of FIG. 1 has opposed first and second major surfaces, 80 and 82.

Next, an anisotropic etch such as a reactive ion etch is used with a large over-etch time to remove the oxide layer 12 from the bottom of the trench and also from the top of the sidewalls 14 leaving exposed silicon at the top of the trench.

Next, a selective epitaxial silicon growth step is performed which grows silicon only on exposed silicon areas, including the bottom of the trench and the top of the sidewalls of the trench. A silicon base 16 is accordingly deposited at the bottom of the trench and a silicon plug 18 formed at the top of the trench. After the plug 18 is fully formed to close the trench silicon stops growing on the base of the trench leaving a void 20 between the sidewalls under the silicon plug 18 and above the base 16.

In the specific example, to prepare for the selective growth step, the device is cleaned followed by an in-situ bake at 1050° C. for 1 minute to remove the native oxide. Selective silicon growth is then carried out at 1050° C. using Trichlorosilane (TCS, SiHCl$_3$) as a precursor, hydrogen as the carrier and a total pressure of 40 Torr.

Some excess silicon is deposited above the trench so a dry etch process is used to etch the silicon back to the trench stopping on the oxide hard mask layer 6, resulting in the structure shown in FIG. 2.

As the skilled person will appreciate, the shape of the trench and the step coverage properties of the silicon determine the size of the void 20 in the trench. Enough silicon should be deposited to fill the top of the trench so that the plug 18 is not removed or opened during etch back.

Processing then continues to form the finished FETs. The hard mask layer 6 is removed using an oxide wet etch. P-type body regions 22 are diffused at the first major surface, and n+ source diffusions 24 deposited at the first major surface within the body region 22. The use of the unfilled trench may allow the subsequent processing to be achieved at higher temperatures, for example 1100° C., instead of lower temperatures, which may be of order 675° C., that might be appropriate for a filled trench.

The plug 18 is deposited undoped for reasons that will be described with reference to FIG. 4. In alternative embodiments, the plug 18 may be doped in-situ, i.e. during growth.

Gate insulator 26 was deposited followed by gate 28 which controls conduction between source diffusion 24 and epilayer 4 which functions as a drift region 4 through the body region 22. The drain is formed by the highly doped substrate 2. Top gate insulator 30 surrounds and insulates the gate. A source contact 31 is connected to source and body regions 22, 24.

In this arrangement, the silicon plug 18 connects the body region 22 on both sides of the trenches improving the electrical connection between the source contact 28 and the body region 22 with no increase in silicon real estate. Moreover, the void 20 prevents difficulties that would otherwise be caused by a filled trench. The void causes less stress than a filled trench. Moreover, manufacture of the structure including the void is much easier than filling the trench with dielectric.

The p-type layers 10 in conjuction with the n-type drift region cause a RESURF effect reducing carriers in the drift region when the device is switched off.

Figure 4:
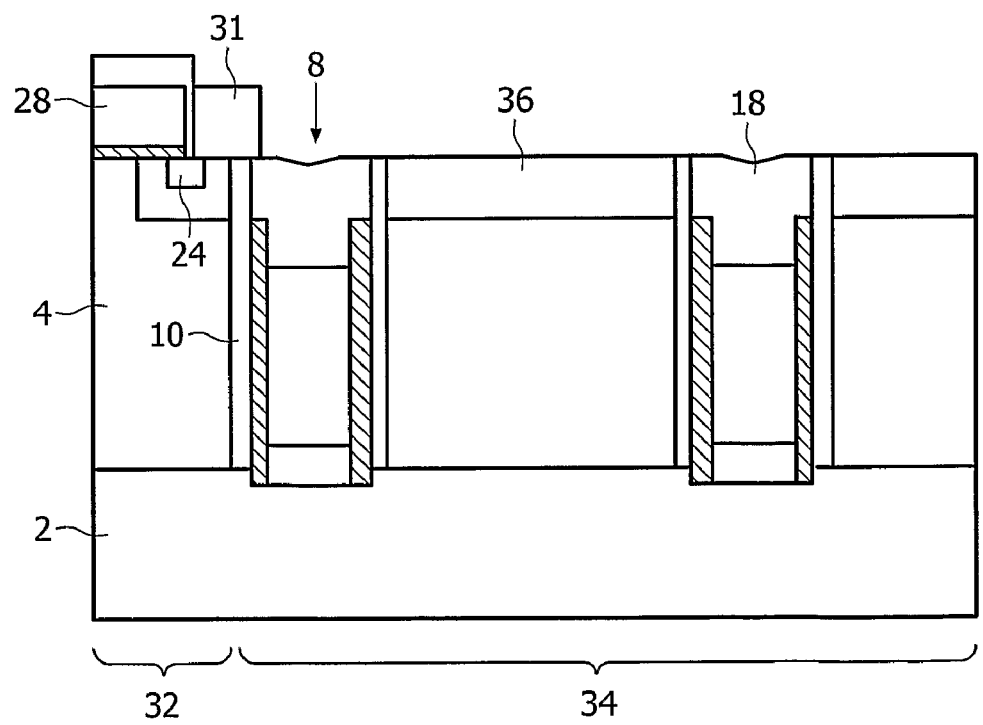
FIG. 4 shows an edge termination structure made according to the first embodiment.

As shown in FIG. 4, the trench is used as an edge termination at the edge of a device 34. In practice, this may be combined with the use of the same trenches in an active region 32, the trenches being used to form a RESURF structure in the active region 32 and an edge termination structure in the edge termination region 34, as shown in FIG. 4.

The plug 18 is in this preferred embodiment be deposited undoped, so that it can be used for edge termination. The plug 18 in the active region 32 can then be doped at the same time as the p-type body regions 22, the back-gate implant or separately.

In the edge termination region 34 there is no source diffusion 24 and edge body regions 36 extend between adjacent trenches. The silicon plug 18 is undoped in the edge termination region 34 and so forms a high resistance connection between adjacent edge body regions. Although only two trenches are shown in FIG. 4 in the edge termination region, in practice there may be many more and accordingly in the edge termination region there is a series of edge body regions 36 and undoped silicon plugs 18 electrically connected in series. Accordingly, voltage between source the source contact 28 and drain 4 can be dropped over the edge region to prevent breakdown at the edge of the device. This achieves a similar effect to that in the prior art WO-A-02/065552 without requiring complex high resistance layers deposited on the surface.

In a second embodiment, the RESURF structure used is not alternating n and p type regions in the drift region but a SIPOS layer.

Figure 5:
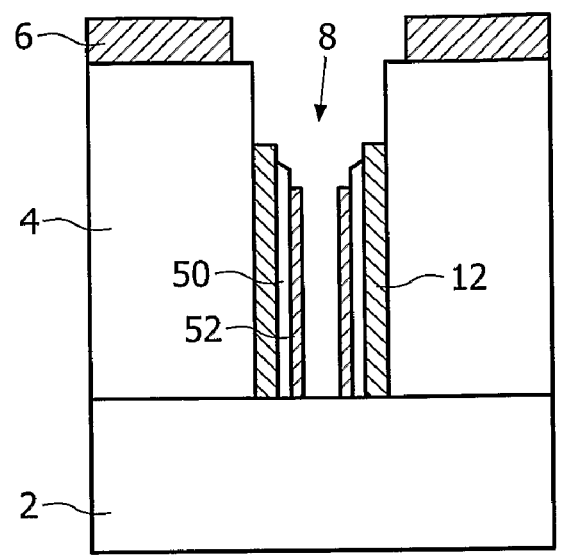
FIG. 5 shows a step in a second embodiment of a method according to the invention.

Referring to FIG. 5, the process is the same as that in the first embodiment until the stage shown in FIG. 1, except that in the second embodiment the vapour phase doping step is not performed.

Next, the insulating layer 12 is etched away from the base of the trench using an anisotropic spacer etch. This insulating layer 12 forms the outer insulating layer in the finished device. Semi-insulating polysilicon 50 is deposited, followed by a layer formed from tetra-ethyl orthosilicate (TEOS layer) 52 which will form the trench insulating layer in the finished device. In the specific embodiment, both of these layers are deposited to a thickness of 300 nm but the skilled person will realise that these figures may vary.

An oxide spacer etch is then performed with a large over-etch to etch trench insulating layer 52 away from the base of the trench and the top of the trench. A SIPOS back etch is performed with a large over-etch to etch away the SIPOS from the top of the trench and the base of the trench, and then a short oxide wet etch removes the oxide layer 10 from the top of the sidewalls, leaving the structure shown in FIG. 5. Note that the oxide hard mask 6 is also etched back a little from the edges of the trench during the oxide wet etch step.

Figure 6:
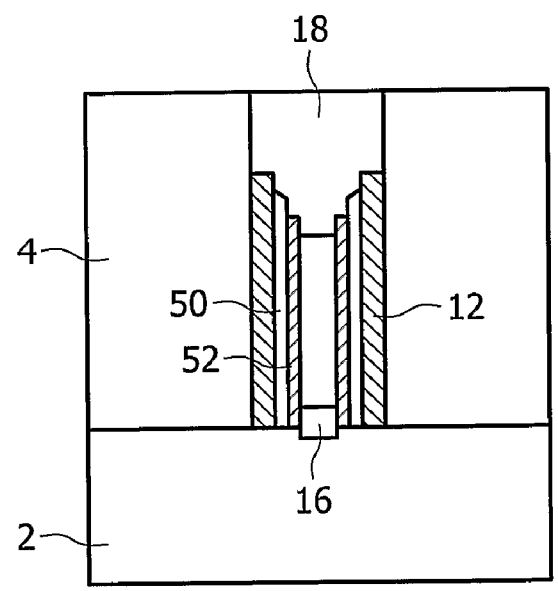
FIG. 6 shows a later step in the second embodiment.

Silicon is then selectively deposited as in the first embodiment forming silicon base 16 at the base of the trench and silicon plug 18 at the top of the trench. Chemical mechanical polishing is then performed to planarise the plug 18. A dry etch is performed to further etch the silicon deposited on exposed part of the top surface adjacent to the trench. The dry etch is followed by an oxide wet etch to remove the oxide hard mask 6, resulting in the device shown in FIG. 6.

Processing then continues as in the first embodiment by forming source, body and gate regions.

A specific benefit compared with conventional SIPOS structures is the reduced stress in the finished device. In prior art structures using 12 microns deep trenches cracking was a problem.

The use of SiPOS improves performance of the device in use since it allows automatic adjustment to take account of charge imbalance.

Although the SIPOS and vapour phase doped embodiments are here presented separately it is also possible to combine SIPOS with vapour phase doping if required. This may either be done simply by combining the steps of the first and second embodiments by including the vapour phase doping step of the first embodiment.

Alternatively, a combined structure may be obtained in accordance with the third embodiment as will now be described with reference to FIG. 7.

In the third embodiment of the invention, processing continues as in the first embodiment up to the step of selectively growing silicon which is performed for a shorter time such that the silicon 70 grown on the top of the sidewalls 14 does not meet leaving a gap 72 between the silicon regions 70.

Figure 7:
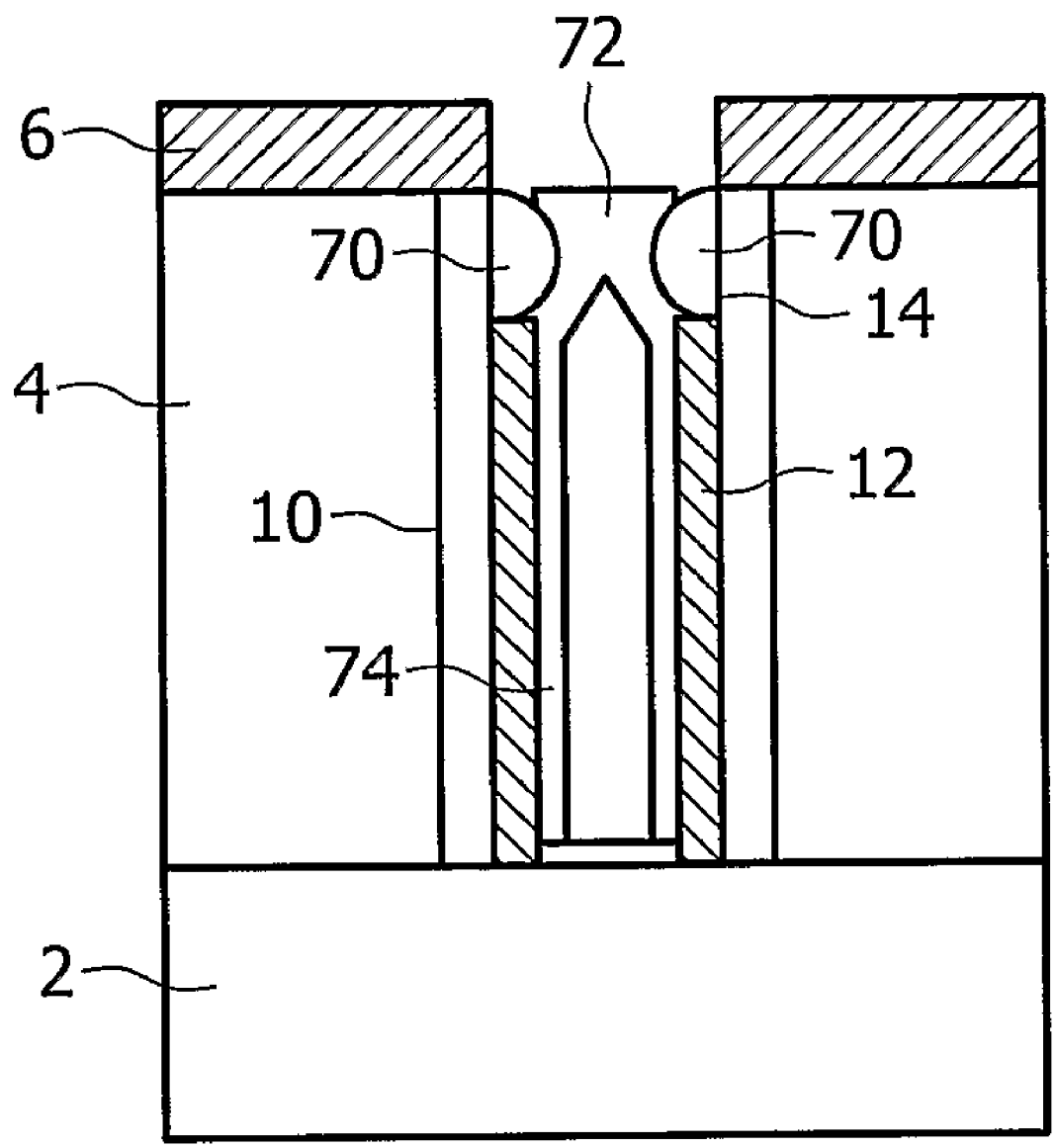
FIG. 7 shows a step in a third embodiment of a method according to the invention.

Next, SIPOS 74 is deposited closing the trench, before planarising the surface, resulting in the device shown in FIG. 7.

Processing then continues as in the previous embodiments.

Although the above description relates to the use of the invention for trench-FETs the same approach can be used for diodes simply by omitting the source region 24. The approach can also be used for other devices using the RESURF effect, for example bipolar transistors and IGBTs.

The invention is applicable to both p and n type devices and accordingly it is possible to reverse the conductivity types from those described above.

The epitaxially grown silicon may be monocrystalline or polycrystalline silicon (poly-Si). Poly-Si may be suitable when undoped for the edge termination structure of FIG. 4 if the resistivity of undoped monocrystalline silicon is too low. On the other hand, for providing improved connection to a p-type body or just to connect p-layers on opposite sides of the trench, doped monocrystalline silicon may be more suitable.

From reading the present disclosure, other variations and modifications will be apparent to persons skilled in the art. Such variations and modifications may involve equivalent and other features which are already known in the design, manufacture and use of semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

The invention claimed is:

1. A method of manufacturing a semiconductor device, comprising:
   (a) providing a silicon semiconductor body having opposed first and second major surfaces having a lower-doped region at the first major surface above a higher doped region, the lower-doped region and the higher doped region both being doped to have a first conductivity type, the lower-doped region having a lower doping than the higher doped region;
   (b) defining a mask having openings on the first major surface;
   (c) forming trenches through the openings in the mask, the trenches extending from the first major surface towards the second major surface through the lower-doped region towards the higher doped region;
   (d) depositing a trench insulating layer on the sidewalls and base of the trenches as well as the first major surface;
   (e) removing the trench insulating layer from the top of the sidewalls of the trenches adjacent to the first major surface leaving exposed silicon at the top of the sidewalls of the trench; and
   (f) growing silicon selectively on the exposed silicon to grow silicon at the top of the trenches and plugging the top of the trenches,
   wherein the method further includes defining a structure for depleting the lower-doped region in an operating state of the semiconductor device to allow the lower-doped region to support a voltage in that operating state.

2. The method as recited in claim 1 further comprising the step of doping the sidewalls of the trenches to have a second conductivity type opposite to the first conductivity type to form the structure for depleting the lower-doped region before depositing the trench insulating layer.

3. The method as recited in claim 1 further comprising:
   (g) forming a body region (22) being semiconductor doped to be of second conductivity type opposite to the first conductivity type at or adjacent to the first major surface (80) and adjacent to the trenches (8).

4. The method as recited in claim 3 further comprising the steps:
   (h) forming a source region of semiconductor doped to be of the first conductivity type at or adjacent to the first major surface and in contact with the body region; and (i) forming an insulated gate for controlling conduction between source region and higher doped region acting as the drain through the body.

5. The method as recited in claim 1 wherein
step (e) comprises overetching to remove the trench insulating layer from the base of the trenches and the first major surface as well as the top of the sidewalls of the trenches adjacent to the first major surface leaving the exposed silicon at the top of the sidewalls of the trench and the base of the trenches.

6. The method as recited in claim 1 further comprising the step of depositing semi-insulating polysilicon on the sidewalls of the trenches to form the structure for depleting the lower-doped region.

7. The method as recited in claim 6 further comprising the steps, after step (c), of:
depositing an outer trench insulating layer on the sidewalls of the trench and the top surface;
removing the outer trench insulating layer from the base of the trench;
followed by the steps of depositing semi-insulating polysilicon in the trench and then step (d) of depositing a trench insulating layer;
wherein step (e) of overetching includes one or more etching steps etching the outer insulating layer, the semi-insulating polysilicon and the trench insulating layer to expose the sidewalls of the trenches adjacent to the first major surface.

8. The method as recited in claim 1 wherein in step (f):
silicon is grown selectively on the exposed sidewalls at the top of the trench leaving a gap between the silicon (70) grown on opposed sidewalls;
a silicon layer is deposited on the first major surface plugging the gap in the trench;
and the silicon layer deposited on the first major surface is removed, leaving the silicon layer plugging the gap.

9. A semiconductor device, comprising:
a silicon semiconductor body having opposed first and second major surfaces having a lower-doped region above a higher-doped region, the lower-doped region and the higher-doped region both being doped to have a first conductivity type;
trenches extending from the first major surface towards the second major surface through the lower-doped region towards the higher doped region;
a silicon plug plugging the top of the trenches above a void in the trenches; and
a structure for depleting the lower-doped region in an operating state of the semiconductor device to allow the lower-doped region to support a voltage in that operating state.

10. A semiconductor device according to claim 9 wherein the semiconductor adjacent to the sidewalls of the trenches is doped to be of a second conductivity type forming the structure for depleting the lower-doped region.

11. The semiconductor device as recited in claim 9 further comprising a layer of semi-insulating polysilicon extending along the sidewalls of the trenches forming the structure for depleting the lower-doped region, the semi-insulating polysilicon being in electrical connection with the semiconductor under the trench and to the silicon plug at the top of the trench.

12. The semiconductor device according to claim 9, having an active region and an edge termination region around the active region, wherein a plurality of the trenches form an edge termination structure in the edge termination region, edge body regions doped to be of second conductivity type opposite to the first conductivity type extend between the trenches in the edge termination region, and the silicon plugs in the trenches in the edge termination region are undoped to form a high-resistance path between the edge body regions on either side of the trenches.

13. A semiconductor device according to claim 12 comprising a plurality of the trenches plugged with a silicon plug in the active region, the silicon plugs in the trenches in the active region being doped to be conductive.

14. The semiconductor device according to claim 9 further comprising:
a body region being semiconductor doped to be of second conductivity type at or adjacent to the first major surface and adjacent to the trenches; and
a source region of semiconductor doped to be of the first conductivity type at or adjacent to the first major surface and in contact with the body region; and
an insulated gate for controlling conduction through the body region between the source region and the higher-doped region acting as a drain.

* * * * *